US006368978B1

(12) United States Patent
Kumar et al.

(10) Patent No.: US 6,368,978 B1
(45) Date of Patent: Apr. 9, 2002

(54) HYDROGEN-FREE METHOD OF PLASMA ETCHING INDIUM TIN OXIDE

(75) Inventors: Ajay Kumar; Padmapani Nallan, both of Sunnyvale; Jeffrey D. Chinn, Foster City, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/262,785

(22) Filed: Mar. 4, 1999

(51) Int. Cl.[7] .................................................. B01J 15/00

(52) U.S. Cl. ........................... 438/722; 38/720; 216/67; 216/74; 216/75

(58) Field of Search ............................. 216/67, 69, 74, 216/75, 76; 438/710, 715, 720, 722

(56) References Cited

U.S. PATENT DOCUMENTS

| | | | | |
|---|---|---|---|---|
| 5,114,872 A | * | 5/1992 | Roselle et al. | 437/48 |
| 5,230,771 A | | 7/1993 | Roselle | 156/643 |
| 5,286,337 A | | 2/1994 | Tsou | 156/643 |
| 5,318,664 A | | 6/1994 | Saia et al. | 156/643 |
| 5,607,602 A | | 3/1997 | Su et al. | 216/76 |
| 5,607,731 A | | 3/1997 | Haynes | 427/529 |
| 5,667,631 A | | 9/1997 | Holland et al. | 216/13 |
| 5,723,366 A | * | 3/1998 | Suzuki et al. | 437/228 |
| 5,980,686 A | * | 11/1999 | Goto | 156/345 |
| 6,008,065 A | * | 12/1999 | Lee et al. | 438/30 |
| 6,036,876 A | * | 3/2000 | Chen et al. | 216/67 |
| 6,051,150 A | * | 4/2000 | Miyakawa | 216/67 |

FOREIGN PATENT DOCUMENTS

| | | | |
|---|---|---|---|
| GB | 2283461 | 5/1995 | C04B/41/53 |

OTHER PUBLICATIONS

J. Molloy et al., "The Reactive Ion Etching of Transparent Electrodes for Flat Panel Displays Using Ar/CI2 Plasmas," J. Electrochem Soc., vol. 142, No. 12, (Dec. 1995), pp. 4285–4289.*

* cited by examiner

*Primary Examiner*—Randy Gulakowski
*Assistant Examiner*—Jiri Smetana
(74) *Attorney, Agent, or Firm*—Shirley L. Church; Joseph Bach

(57) ABSTRACT

The present invention is a method for hydrogen-free plasma etching of indium tin oxide using a plasma generated from an etchant gas containing chlorine as a major constituent (i.e., chlorine comprises at least 20 atomic %, preferably at least 50 atomic %, of the etchant gas). Etching is performed at a substrate temperature of 100° C. or lower. The chlorine-comprising gas is preferably $Cl_2$. The etchant gas may further comprise a non-reactive gas, which is used to provide ion bombardment of the surface being etched, and which is preferably argon. The present invention provides a clean, fast method for plasma etching indium tin oxide. The method of the invention is particularly useful for etching a semiconductor device film stack which includes at least one layer of a material that would be adversely affected by exposure to hydrogen, such as N- or P-doped silicon.

12 Claims, 3 Drawing Sheets

202 202 204 206 208 210 212 214 216

HYDROGEN-FREE METHOD OF PLASMA ETCHING INDIUM TIN OXIDE

BACKGROUND OF THE INVENTION

1. Field of the Invention

The present invention pertains to a hydrogen-free method for the plasma etching of indium tin oxide (ITO).

2. Brief Description of the Background Art

Indium tin oxide is a material having electro-optical properties which are useful in electronic devices. Various methods for etching indium tin oxide are described, for example, in U.S. Pat. No. 5,286,337, to Tsou; U.S. Pat. No. 5,318,664, to Saia et al.; U.S. Pat. No. 5,607,602, to Su et al.; U.S. Pat. No. 5,667,631, to Holland et al.; and U.K. Patent Application No. GB 2,283,461, of Kretschmer et al.

Most prior art methods for etching indium tin oxide involve the use of a hydrogen-containing etchant gas, such as hydrogen bromide (HBr). However, certain materials that may be present in semiconductor devices are adversely affected by the presence of hydrogen. It would therefore be desirable to provide an essentially hydrogen-free method for etching indium tin oxide.

SUMMARY OF THE INVENTION

We have discovered that particular semiconductor devices which include N- or P-doped silicon at device locations which would be exposed during etching of the indium tin oxide are harmed by the use of a hydrogen-containing etchant material. An example of such a device is illustrated in FIG. 2. FIG. 2 shows a film stack for a CMOS device which comprises the following layers, from top to bottom: photoresist mask, 202; indium tin oxide, 204; P-type silicon, 206; I-type (i.e., undoped) silicon, 208; N-type silicon, 210; titanium barrier/wetting layer, 212; and aluminum/copper alloy, 214; all deposited upon a silicon substrate, 216. The film stack is patterned using a commercially available photoresist masking material. To form the CMOS device, it is necessary to etch through the indium tin oxide layer 204 and the amorphous silicon layers, including the P-type silicon layer 206, the I-type silicon layer 208, and the N-type silicon layer 210.

As described above, commonly used processes for etching indium tin oxide involve the use of HBr as the primary etchant gas. However, overetch during the indium tin oxide etch step often extends into the I-type silicon layer 206. The use of HBr, or any other hydrogen-containing gas, during the indium tin oxide etch causes damage to the P-type silicon layer which is exposed during overetch of the indium tin oxide layer. As such, hydrogen is not well tolerated during the indium tin oxide etching process.

The present invention provides a hydrogen-free method for the plasma etching of indium tin oxide. The etching method is preferably carried out at low temperatures (i.e., about 100° C. or lower), so that the properties of the CMOS device are not degraded.

The method comprises exposing indium tin oxide to a plasma generated from an etchant gas which contains no hydrogen. Chlorine is a major constituent of the etchant gas, comprising at least 20 atomic % and, preferably, at least 50 atomic %, of the etchant gas. The chlorine-comprising gas is preferably $Cl_2$.

The etchant gas preferably further comprises a non-reactive gas which is selected from the group consisting of argon, xenon, krypton, and combinations thereof, and is most preferably argon.

The etchant gas may further include a diluent gas, such as nitrogen.

The etchant gas composition preferably comprises $Cl_2$ and argon in a volumetric flow rate ratio within the range of about 1:2 to about 1:0; more preferably, within the range of about 1:1 to about 1.5:1; most preferably, approximately 1:1.

The plasma is preferably a high density plasma having an ion density of at least about $10^{11}$ $e^-/cm^3$, most preferably, within the range of about $10^{11}$ $e^-/cm^3$ to about $10^{12}$ $e^-/cm^3$. The process chamber pressure is preferably within the range of about 2 mT to about 50 mT. The substrate temperature is preferably within the range of about 50° C. to about 90° C. The chamber wall temperature is preferably within the range of about 65° C. to about 80° C.

The present invention provides a clean, fast (i.e., greater than about 1200 Å per minute) method for etching indium tin oxide. This compares with a typical etch rate of about 900 Å per minute or less using prior art methods which utilize HBr as the principal etchant gas. The method of the invention also results in less byproduct deposition than methods utilizing HBr, because the byproducts of chlorine-based etch tend to be more volatile (and, therefore, more easily removed from the processing chamber) than those produced during a bromine-based etch.

DETAILED DESCRIPTION OF THE INVENTION

We have discovered an improved method for hydrogen-free etching of indium tin oxide. The method itself and preferred process parameters for performing the method of the invention are described in detail below.

I. DEFINITIONS

As a preface to the detailed description, it should be noted that, as used in this specification and the appended claims, the singular forms "a", "an", and "the" include plural referents, unless the context clearly dictates otherwise.

Specific terminology of particular importance to the description of the present invention is defined below.

The term "anisotropic etching" refers to etching which does not proceed in all directions at the same rate.

The term "chlorine" as used herein is intended to encompass $Cl_2$ as well as other chlorine-comprising compounds which are capable of producing reactive etchant species.

The term "indium tin oxide" (also known as "indium doped tin oxide") typically refers to a compound having the chemical formula In: $SnO_2$, where indium is used as a dopant with the tin oxide.

II. AN APPARATUS FOR PRACTICING THE INVENTION

Any suitable etch processing apparatus that is useful in the etching of indium tin oxide can be used in the method of the invention, provided that the apparatus includes a temperature control that is capable of maintaining a substrate temperature of 100° C. or less. The Applied Materials' CENTURA® DPS™ multi-chamber polysilicon etch system is an example of an apparatus which is suitable for use in etching indium tin oxide according to the method of the invention.

Figure 1A:
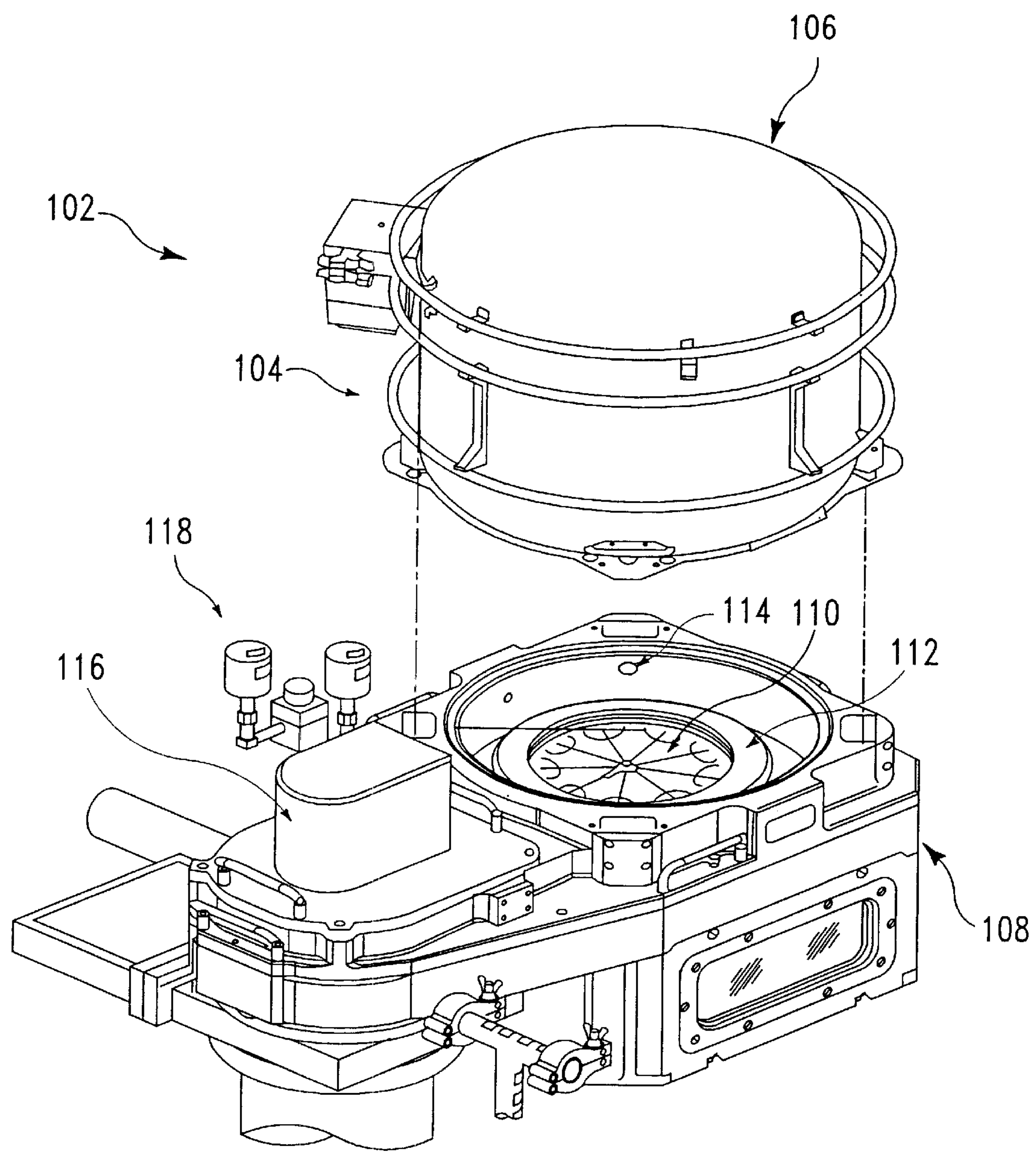
FIGS. 1A and 1B are schematics of an individual polysilicon etch chamber of the type used in an Applied Materials' CENTURA® DPS™ multi-chamber polysilicon etch system, which is an example of an etch processing apparatus which can be used for etching indium tin oxide according to the method of the invention.
Figure 1B:
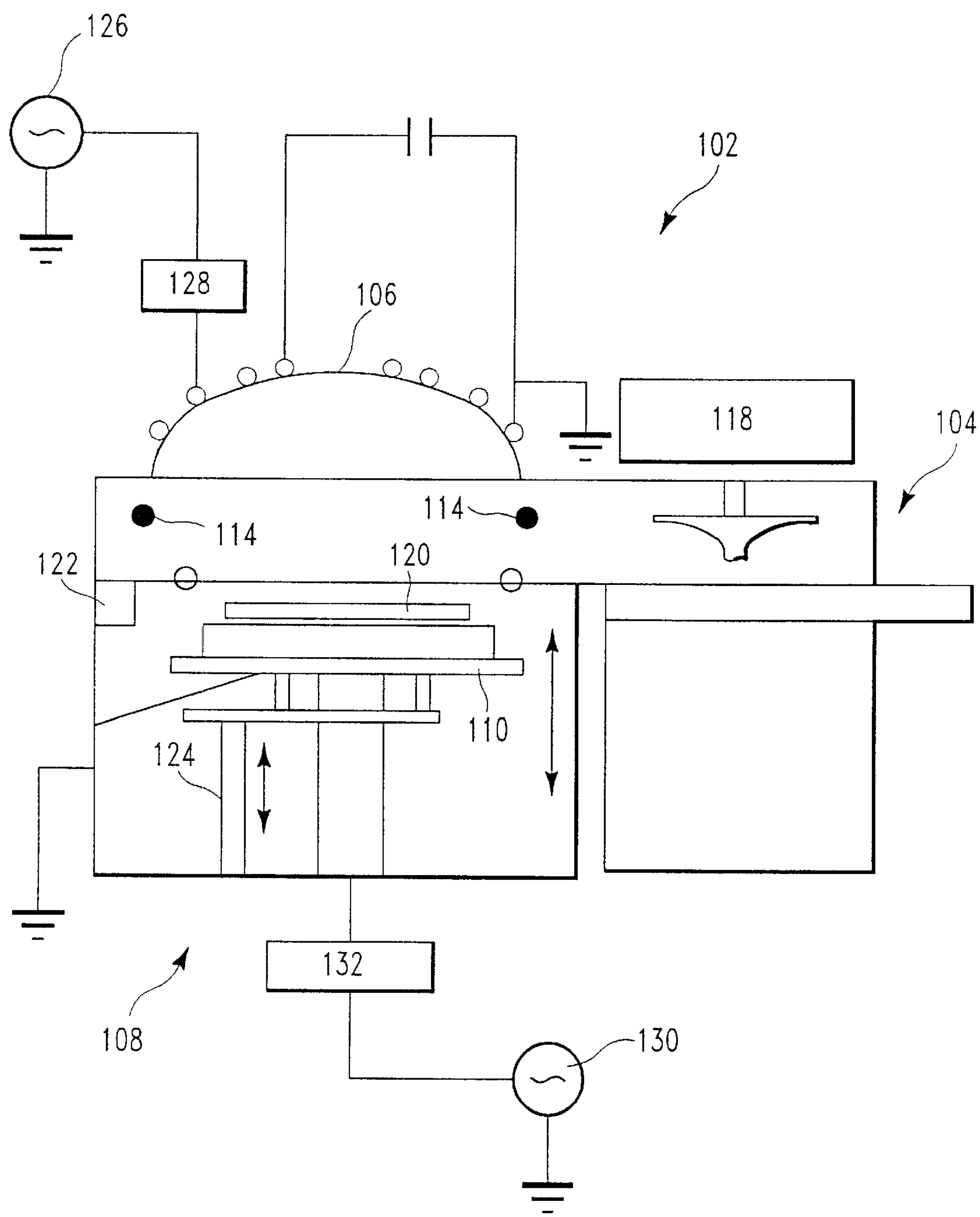

FIGS. 1A and 1B are schematics of an individual polysilicon etch chamber 102 of the type used in the Applied Materials' CENTURA® DPS™ multi-chamber polysilicon etch system. The DPS™ M polysilicon etch chamber 102 is configured to be mounted on a standard CENTURA® 5200 etch mainframe. Up to four of these chambers can be integrated onto the same platform.

FIG. 1A shows a detailed schematic of an individual polysilicon etch chamber 102 of the type used in the CENTURA® DPS™ etch system. The polysilicon etch chamber 102 consists of an upper chamber 104 having a ceramic dome 106, and a lower chamber 108. The lower chamber 108 includes a standard monopolar electrostatic chuck (ESC) cathode 110. Gas is introduced into the chamber via four ceramic gas injection nozzles 114 for uniform gas distribution. Chamber pressure is controlled by a closed-loop pressure control system 116 with a throttle valve 118.

FIG. 1B shows a cross-sectional side view of the polysilicon etch chamber 102. During processing, a substrate 120 is introduced into the lower chamber 108 through inlet 122. The substrate 120 is held in place by means of a static charge generated in the electrostatic chuck (ESC) cathode 110 by applying a DC voltage to a conductive layer located under a dielectric film on the chuck surface. The cathode 110 and substrate 120 are then raised by means of a wafer lift 124 and sealed against the upper chamber 104 in position for processing. Etch gases are introduced into the upper chamber 104 via the ceramic gas injection nozzles 114.

The polysilicon etch chamber 102 uses an inductively coupled source 126 at 12.56 MHz for generating and sustaining a high density plasma. The wafer is biased with an RF source 130 at 13.56 MHz. Power to the plasma source 126 and substrate biasing means 130 are controlled by separate controllers, 128 and 132, respectively. In the case of the Applied Materials' CENTURA® DPS™ polysilicon etch chamber, plasma ions and neutrals are generated directly in the etching chamber. However, alternative equipment utilizing, for example and not by way of limitation, a capacitively coupled plasma generator or a microwave plasma generator for remote generation of plasma ions and neutrals may also be used in the practice of the present invention.

III. THE METHOD FOR HYDROGEN-FREE ETCHING OF INDIUM TIN OXIDE

The method of the invention comprises exposing indium tin oxide to a plasma generated from an etchant gas which contains no hydrogen. Etching is typically and preferably performed at a substrate temperature of 100° C. or lower.

Chlorine is a major constituent of the etchant gas, that is, chlorine comprises at least 20 atomic % and, preferably, at least 50 atomic %, of the etchant gas. The chlorine-comprising gas is preferably $Cl_2$.

The etchant gas preferably further comprises a non-reactive gas which is used to provide ion bombardment of the surface being etched. This physically active gas is preferably selected from the group consisting of argon, xenon, krypton, and combinations thereof, and is most preferably argon.

The etchant gas may further include a diluent gas, such as nitrogen.

The etchant gas composition preferably comprises $Cl_2$ and argon in a volumetric flow rate ratio within the range of about 1:2 to about 1:0; more preferably, within the range of about 1:1 to about 1.5:1; most preferably, approximately 1:1.

The plasma is preferably a high density plasma having an ion density of at least about $10^{11}$ $e^-/cm^3$, most preferably, within the range of about $10^{11}$ $e^-/cm^3$ to about $10^{12}$ $e^-/cm^3$.

Figure 2:
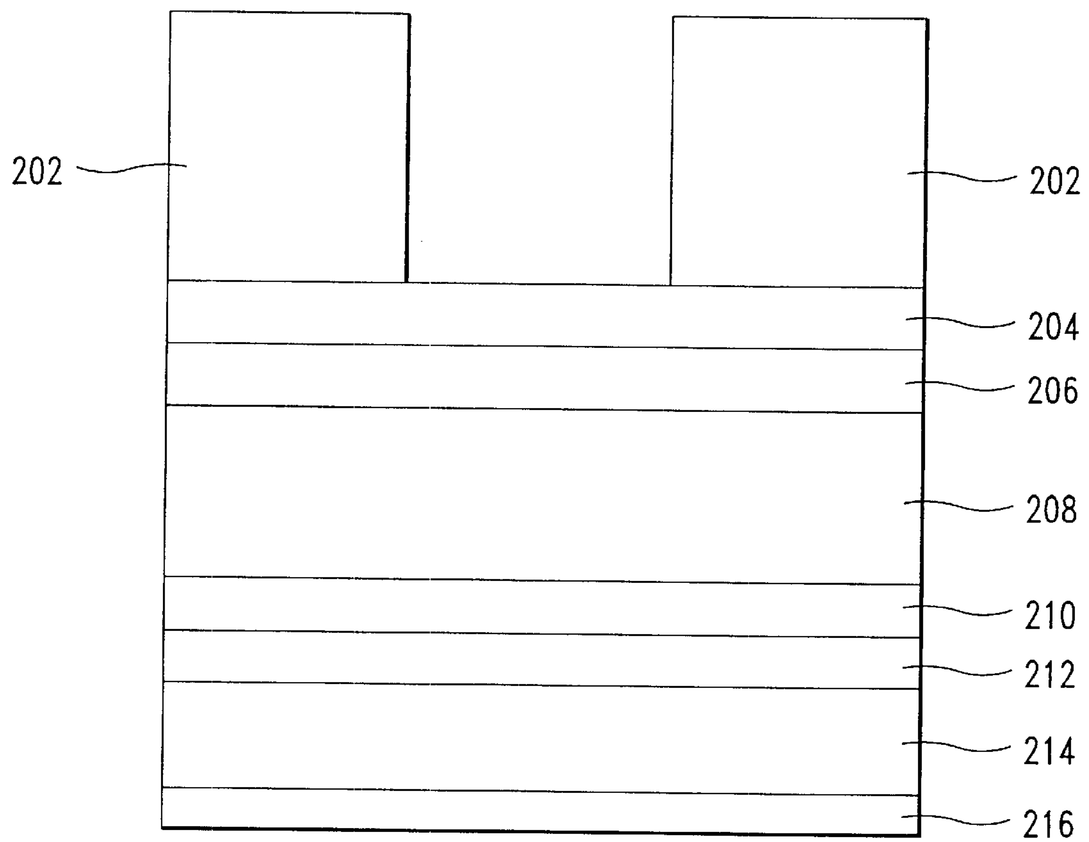
FIG. 2 shows a film stack for a CMOS device including the following layers, from top to bottom: photoresist mask, 202; indium tin oxide, 204; P-type silicon, 206; I-type (i.e., undoped) silicon, 208; N-type silicon, 210; titanium barrier layer, 212; aluminum/copper alloy, 214; and silicon substrate, 216.

Table One, below, provides preferred process conditions for hydrogen-free etching of indium tin oxide according to the method of the invention, using the Applied Materials' CENTURA® DPS™ etch system, which is shown in FIGS. 1 and 2 and described in Section II, above.

TABLE ONE

Preferred Process Conditions for Etching Indium Tin Oxide

| Process Parameter | Preferred Process Conditions | More Preferred Process Conditions | Optimum Known Process Conditions |
|---|---|---|---|
| Plasma Source Power (W) | 50–1500 | 800–1200 | 1000 |
| Substrate Bias Power (W) | 50–500 | 200–300 | 250 |
| $Cl_2$ Flow Rate (sccm) | 50–200 | 100–200 | 100 |
| Ar Flow Rate (sccm) | 0–200 | 50–150 | 100 |
| Typical Total Gas Flow (sccm) | 50–400 | 150–350 | 200 |
| Process Chamber Pressure (mT) | 2–50 | 4–10 | 8 |
| Substrate Temperature (° C.) | <100 | 10–100 | 50–90 |
| Plasma Ion Density($e^-/cm^3$) | $>10^{11}$ | $10^{11}$–$10^{12}$ | $10^{11}$–$10^{12}$ |

Our preliminary experiments have shown indium tin oxide etch rates of at least 1200 Å per minute when an etchant gas mixture comprising chlorine and argon in a 1:1 volumetric flow rate ratio was used. An indium tin oxide etch rate of about 900 Å per minute or less is typically obtained when HBr is used as the principal etchant gas.

The method of the invention is particularly useful for etching a semiconductor device film stack which includes at least one layer of a material that would be adversely affected by exposure to hydrogen, such as doped or undoped amorphous silicon.

The above described preferred embodiments are not intended to limit the scope of the present invention, as one skilled in the art can, in view of the present disclosure, expand such embodiments to correspond with the subject matter of the invention claimed below.

We claim:

1. A hydrogen-free method for plasma etching of indium tin oxide, wherein said method comprises exposing indium tin oxide to a plasma generated from an etchant gas comprising at least 20 atomic % chlorine and no hydrogen, wherein said etchant gas comprises $Cl_2$ and a non-reactive gas selected from the group consisting of argon, xenon, krypton, and combinations thereof, and wherein a volumetric flow rate ratio of said $Cl_2$: non-reactive gas is within the range of about 1:4 to about 4:1.

2. The method of claim 1, wherein said $Cl_2$ and said non-reactive gas are provided in a volumetric flow rate ration within the range of about 1:1 to about 1.5:1.

3. The method of claim 2, wherein said $Cl_2$ and said non-reactive gas are provided in a volumetric flow rate ratio of approximately 1:1.

4. A hydrogen-free method for plasma etching of indium tin oxide, wherein said method comprises exposing indium tin oxide to a plasma generated from an etchant gas comprising at least 20 atomic % chlorine, wherein hydrogen is absent from said etchant gas, and wherein doped silicon directly underlies said indium tin oxide and is exposed during etching of said indium tin oxide.

5. The method of claim 4, wherein said method is performed at a substrate temperature of 100° C. or lower.

6. The method of claim 4, wherein chlorine comprises at least 50 atomic % of said etchant gas.

7. The method of claim 4, wherein said etchant gas comprises $Cl_2$.

8. The method of claim 4 or claim 5 or claim 6 or claim 7, wherein said etchant gas further comprises a non-reactive gas which is selected from the group consisting of argon, xenon, krypton, and combinations thereof.

9. The method of claim 8, wherein said non-reactive gas is argon.

10. The method of claim 8, wherein said $Cl_2$ and said non-reactive gas are provided in a volumetric flow rate ratio within the range of about 1:4 to about 4:1.

11. The method of claim 10, wherein said $Cl_2$ and said non-reactive gas are provided in a volumetric flow rate ration within the range of about 1:1 to about 1.5:1.

12. The method of claim 11, wherein said $Cl_2$ and said non-reactive gas are provided in a volumetric flow rate ratio of approximately 1:1.

* * * * *